US007391033B1

(12) United States Patent
Adler

(10) Patent No.: US 7,391,033 B1
(45) Date of Patent: Jun. 24, 2008

(54) SKEW-ORIENTED MULTIPLE ELECTRON BEAM APPARATUS AND METHOD

(75) Inventor: David L Adler, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 271 days.

(21) Appl. No.: 11/257,304

(22) Filed: Oct. 24, 2005

Related U.S. Application Data

(60) Provisional application No. 60/678,866, filed on May 4, 2005.

(51) Int. Cl.
*G01K 1/08* (2006.01)
(52) U.S. Cl. .................................. 250/398; 250/492.2
(58) Field of Classification Search ................ 220/398; 250/398
See application file for complete search history.

(56) References Cited

U.S. PATENT DOCUMENTS

| 5,578,821 | A | | 11/1996 | Meisberger et al. |
| 5,973,323 | A | | 10/1999 | Adler et al. |
| 6,137,113 | A | * | 10/2000 | Muraki ................. 250/492.22 |
| 2004/0081350 | A1 | * | 4/2004 | Kitamura et al. ........... 382/149 |

OTHER PUBLICATIONS

Sky Scalable High Performance Computers by SKYComputers, webpage [online]. Sky Computers, Inc. 2002, [retrieved on Nov. 4, 2002]. Retrieved from the Internet: http://www.skycomputers.com/hardware/hpc.html.
Tromp, R.M, "Low-energy electron microscopy", IBM J.RES. Develop, Jul. 2000, pp. 503-516, vol. 44, No. 4, International Business Machines Corporation.
Chang, T.H. Philip, et al. "Multiple Electron-Beam Lithography", pp. 1-26.
Diebold, Alain, et al. "Current State of Defect Review by Electron Beam Tools: A White Paper", Jan. 14, 2000, pp. 1-12, Technology Transfer#00013877 A-Eng., SEMATECH.
Tobin, Kenneth W. "Inspection in Semiconductor Manufacturing", pp. 1-13 (K.W. Tobin submission for: V. Sankaran, C.M. Weber, K.W. Tobin "Inspection in Semiconductor Manufacturing", *Webster's Encyclopedia of Electrical and Electronic Engineering*, vol. 10, pp. 242-262, Wiley & Sons, NY, NY, 1999.

* cited by examiner

*Primary Examiner*—David A. Vanore
*Assistant Examiner*—Phillip A. Johnston
(74) *Attorney, Agent, or Firm*—Okamoto & Benedicto LLP

(57) ABSTRACT

One embodiment described relates to a multiple electron beam apparatus. Multiple columns are arranged in a row configured to generate multiple electron beams. A mechanism is included for translating a substrate so as to be impinged upon by the multiple electron beams. A direction of the substrate translation and a direction of the row of columns are at a skew angle.

19 Claims, 11 Drawing Sheets

SKEW-ORIENTED MULTIPLE ELECTRON BEAM APPARATUS AND METHOD

CROSS-REFERENCE TO RELATED APPLICATION

The present invention claims the benefit of U.S. Provisional Patent Application No. 60/678,866, entitled "Skew-Oriented Multiple Electron Beam Apparatus and Method," filed May 4, 2005 by inventor David L. Adler, the disclosure of which is hereby incorporated by reference in its entirety.

BACKGROUND OF THE INVENTION

1. Field of the Invention

The present invention relates generally to microscopic inspection methods and apparatus. The present invention relates more particularly to automated inspection systems for semiconductor manufacturing.

2. Description of the Background Art

A variety of methods have been used to examine microscopic surface structures of semiconductors. These have important applications in the field of semiconductor integrated circuit (IC) fabrication, where microscopic defects at a surface layer make the difference between a good or bad IC. For example, holes or vias in an intermediate insulating layer often provide a physical conduit for an electrical connection between two outer conducting layers. If one of these holes or vias becomes clogged, it will be impossible to establish this electrical connection. Automated inspection of the semiconductors is used to ensure a level of quality control in the manufacture of the integrated circuits.

An example of a conventional electron beam (e-beam) apparatus for an inspection system is described in U.S. Pat. No. 5,578,821, issued to Meisberger et al (the Meisberger patent). The disclosure of the Meisberger patent is hereby incorporated by reference in its entirety.

SUMMARY

One embodiment of the invention pertains to a multiple electron beam apparatus. Multiple columns are arranged in a row configured to generate multiple electron beams. A mechanism is included for translating a substrate so as to be impinged upon by the multiple electron beams. A direction of the substrate translation and a direction of the row of columns are at a skew angle.

DETAILED DESCRIPTION

Figure 1:
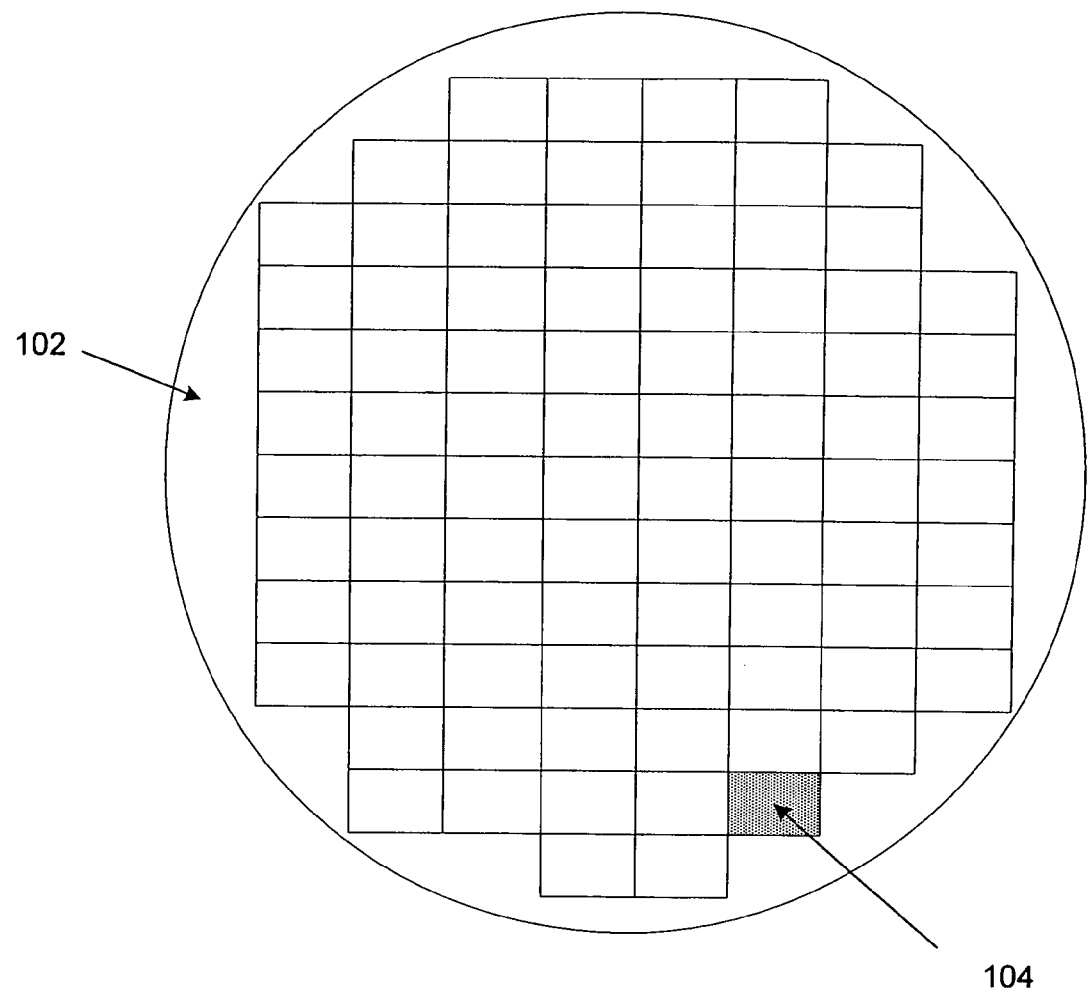
FIG. 1 is a schematic depiction of a multitude of integrated circuit dies for manufacture on a semiconductor wafer.

FIG. 1 is a schematic depiction of a multitude of integrated circuit dies for manufacture on a semiconductor wafer. The semiconductor wafer 102 typically comprises a silicon wafer. The wafer 102 may be, for example, two hundred millimeters (200 mm) or three hundred millimeters (300 mm) in diameter. On the surface of the wafer 102, numerous integrated circuit dies 104 are manufactured thereon. The integrated circuits may comprise, for example, microprocessors, memories, digital logic, analog circuits, and other circuitry.

Figure 2:
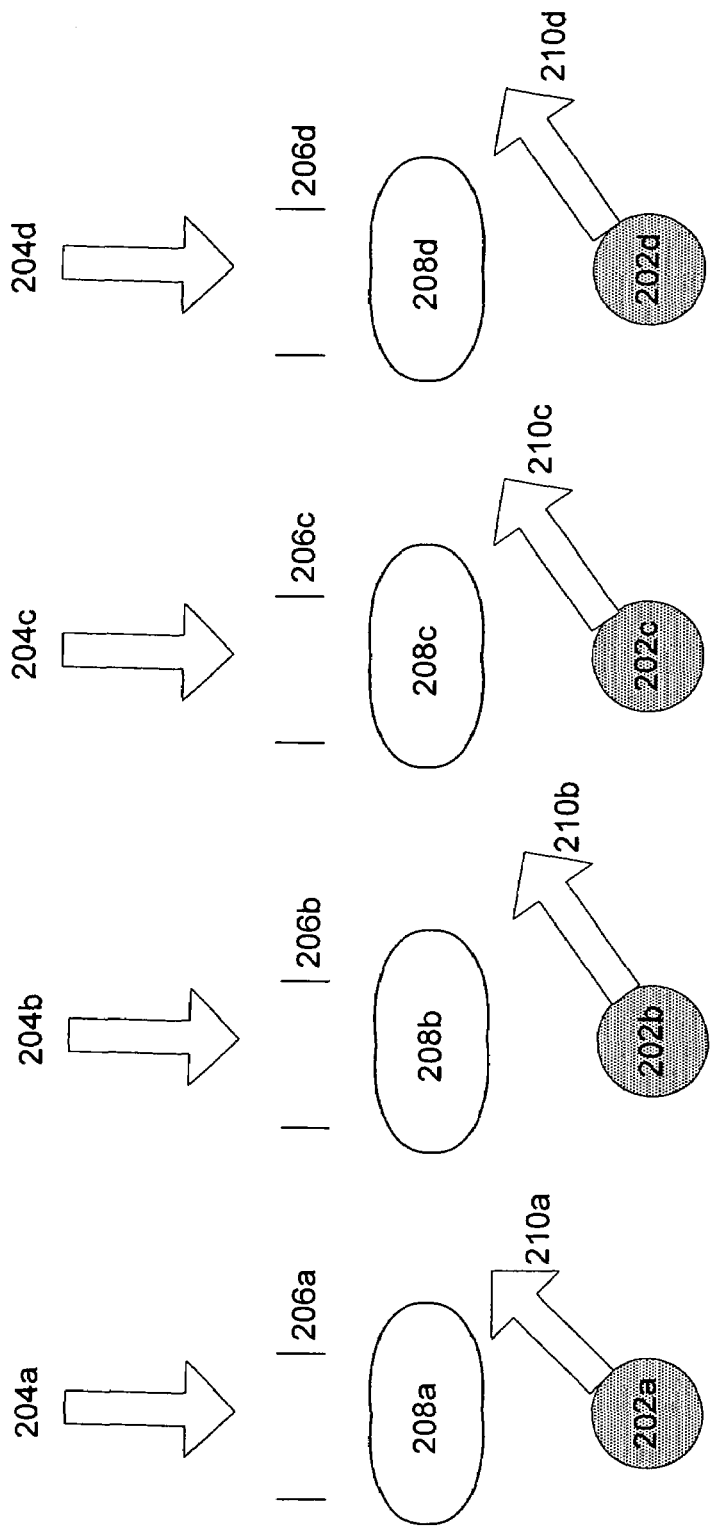
FIG. 2 is a schematic diagram illustrating elements of a multiple e-beam apparatus with multiple e-beam columns in accordance with an embodiment of the invention.

FIG. 2 is a schematic diagram illustrating elements of a multiple e-beam apparatus with multiple e-beam columns in accordance with an embodiment of the invention. The illustrated apparatus 200 includes four columns (a, b, c, d) which may scan four electron beams over a corresponding four areas (202a, 202b, 202c, 202d) of a specimen being examined. While four columns are shown in FIG. 2 for purposes of ease of illustration, a multitude of such columns may be implemented, with the specific number depending on the system specifications.

In the embodiment illustrated, each column includes at least a source, a condensor lens system, a scan deflector, and an objective lens. The sources, one for each column, generate incident electron beams (204a, 204b, 204c, 204d). In one embodiment, each of the sources may comprise an electron source. The electron source may be implemented, for example, using a field emission electron gun and a condenser lens system.

The incident beams are controllably scanned by scan deflectors (206a, 206b, 206c). These scan deflectors may, for example, be electrostatic deflectors. A microcontroller system may be configured to control the deflectors so as to scan the e-beams in accordance with an inspection plan (for an inspection system) or in accordance with a writing pattern (for a lithography system).

The incident beams subsequently travel to objective lenses (208a, 208b, 208c, 208d). Each objective lens may comprise, for example, a configuration of electromagnetic pole pieces. Alternatively, one or more of the objective lenses may be electrostatic (rather than magnetic). The objective lenses focus the incident beams onto the specimen.

Due to impingement of the multiple incident beams onto the specimen, electrons are emitted from the surface of the specimen. The scattered electrons (210a, 210b, 210c, 201d) generated by the impingement are detected by detection systems.

Figure 3:
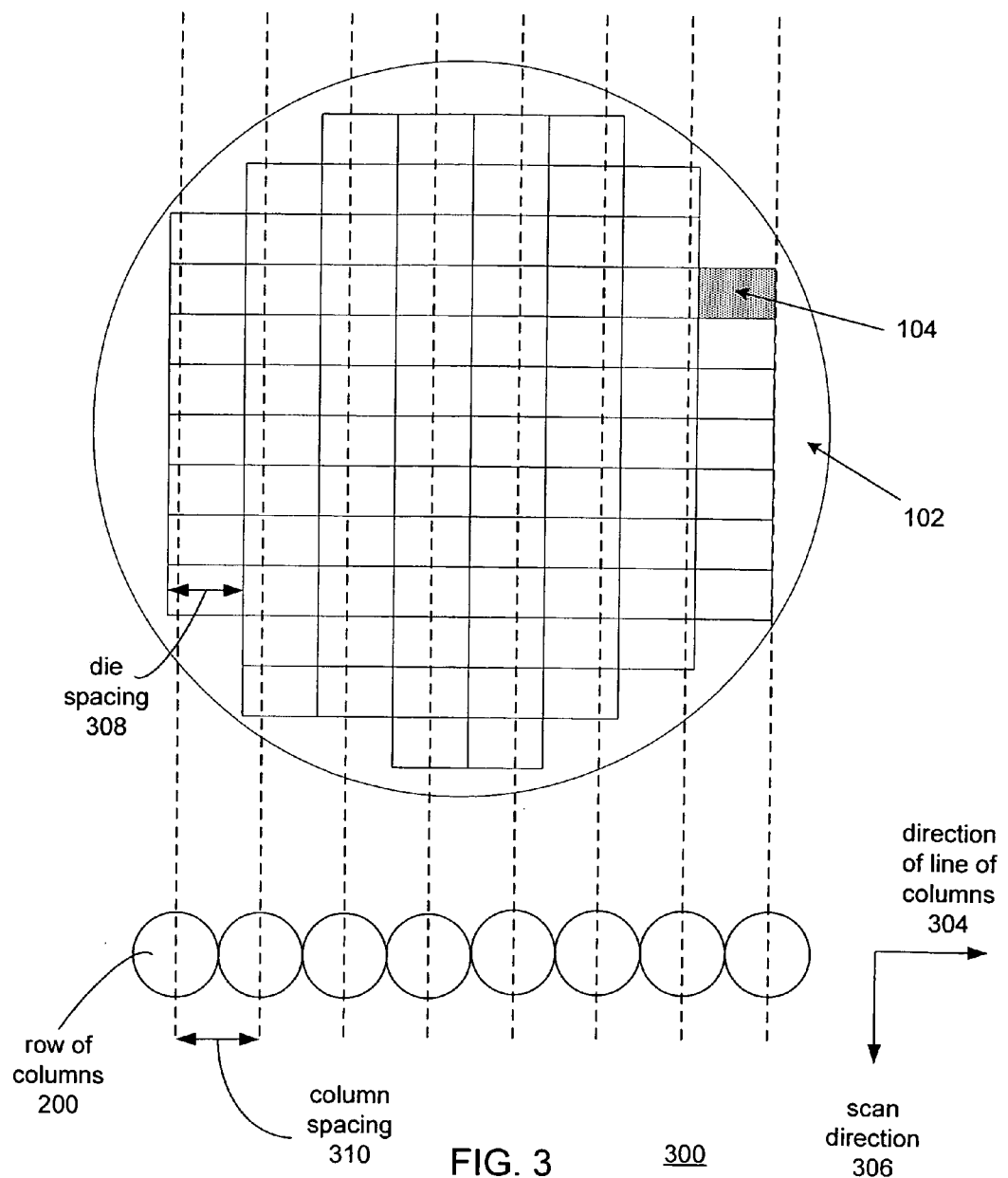
FIG. 3 is a schematic diagram illustrating a perpendicular orientation of a single row of e-beam columns with respect to a translation direction of a semiconductor wafer.

FIG. 3 is a schematic diagram illustrating a perpendicular orientation 300 of a row 200 of e-beam columns with respect to a translation (scan) direction 306 of a semiconductor wafer 102. The e-beam columns in the row 200 are arranged along a line in a direction 304 which is perpendicular to the scan direction 306 of the wafer 102.

As shown in FIG. 3, the columns are spaced by a column spacing distance 310, while the dies 104 of the wafer 102 are spaced by a die spacing distance 308. In this example, the die spacing 308 is shorter than the column spacing 310. In other words, there is a mismatch between the die spacing and the column spacing.

Because the column spacing 310 is not commensurate with the die spacing 308, inefficiencies and complications are introduced into the system. In an inspection system, the "care areas" on each die according to the desired inspection plan are not efficiently scanned simultaneously by all columns or beams. In other words, some columns may be aligned with a "care area" while other columns may not be aligned with (i.e. may miss) the "care area". In an e-beam writing system, different deflection control signals are sent to the various columns to accomplish the desired writing pattern.

Figure 4:
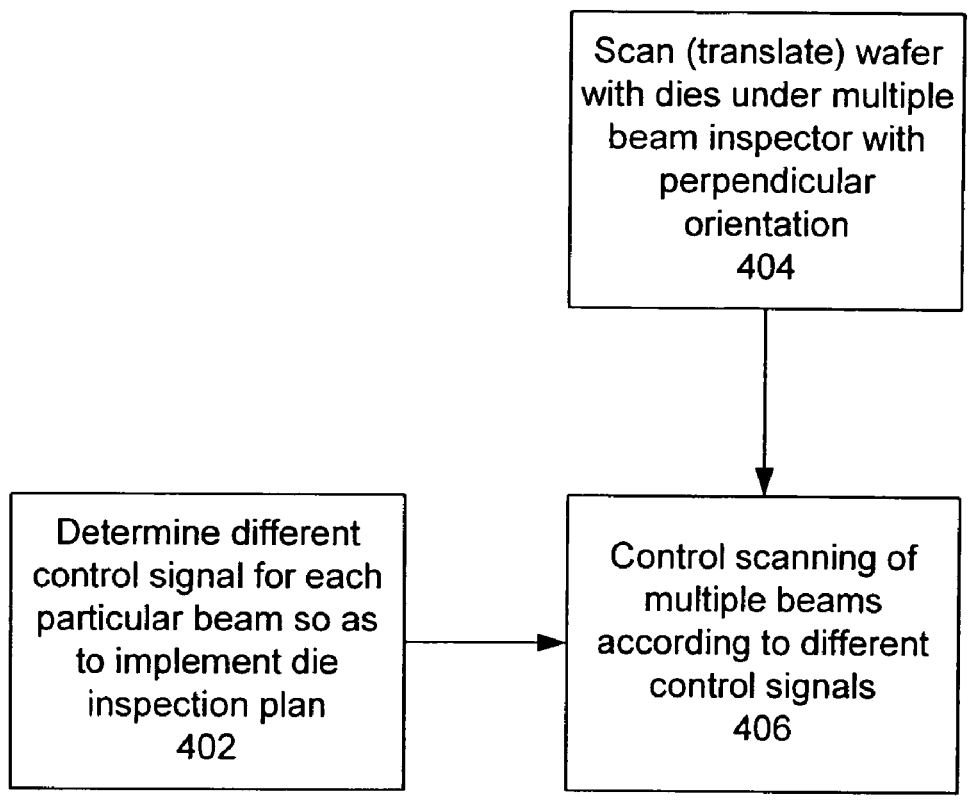
FIG. 4 is a flow chart of a method of multi-beam inspection utilizing a perpendicular orientation.

FIG. 4 is a flow chart of a method 400 of multi-beam inspection utilizing a perpendicular orientation. In this method 400, because the perpendicular angle between the scan direction 306 and the line of columns 304, a different control signal is determined 402 for each particular beam so as to implement the desired die inspection plan. This is because of the mismatch between the die spacing 308 and the column spacing 310. The mismatch means that different columns are at different locations relative to the dies 104 on the wafer 102, so that different control signals are needed for the different columns.

Hence, when a wafer with dies is scanned (translated) 404 under the multiple beam inspector with such a perpendicular orientation, then the scanning of multiple beams is controlled 406 according to different control signals. In other words, the scanning for each beam is controlled 406 according to a particular control signal specific for that column. This introduces inefficiencies and complications into the inspection system. For example, inspection "care areas" are not efficiently scanned simultaneously by the multiple beams.

Figure 5:
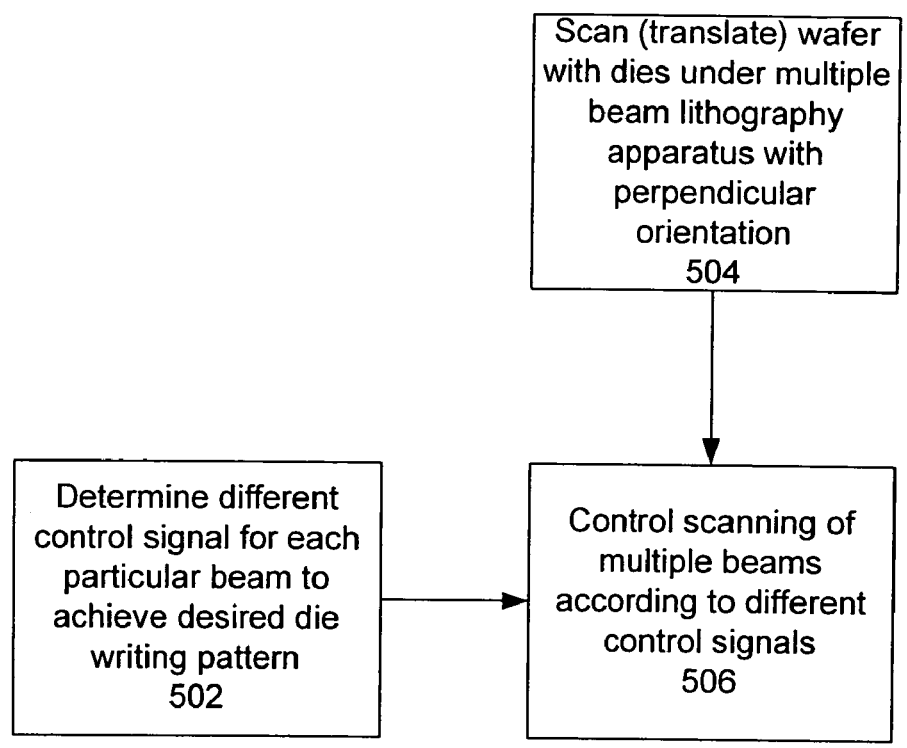
FIG. 5 is a flow chart of a method of multi-beam lithography utilizing a perpendicular orientation.

FIG. 5 is a flow chart of a method 500 of multi-beam lithography utilizing a perpendicular orientation. In this method 500, because the perpendicular angle between the scan direction 306 and the line of columns 304, a different control signal is determined 502 for each particular beam so as to achieve the desired die writing pattern. This is because of the mismatch between the die spacing 308 and the column spacing 310. The mismatch means that different columns are at different locations relative to the dies 104 on the wafer 102, so that different control signals are needed for the different columns.

Hence, when a wafer with dies is scanned (translated) 504 under the multiple beam e-beam lithography system with such a perpendicular orientation, then the scanning of the multiple beams is controlled according to the different control signals. In other words, the scanning for each beam is controlled 506 according to a particular control signal specific for that column. This introduces inefficiencies and complications into the e-beam lithography system. For example, the data path from a desired writing pattern to control signals for the columns becomes more complicated.

Figure 6:
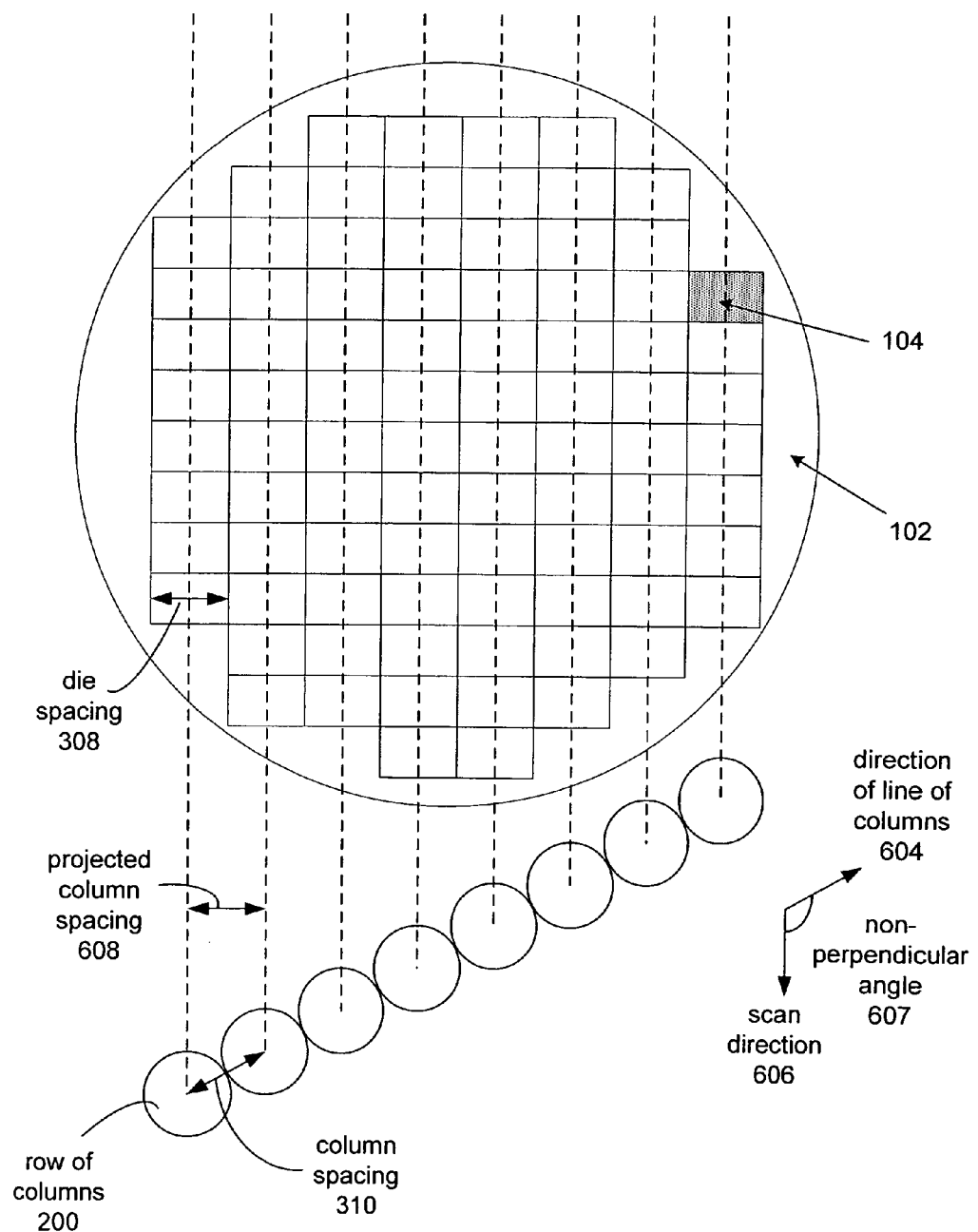
FIG. 6 is a schematic diagram illustrating a skew orientation of a row of e-beam columns with respect to a translation direction of a semiconductor wafer in accordance with an embodiment of the invention.

FIG. 6 is a schematic diagram illustrating a skew orientation 600 of a row 200 of e-beam columns with respect to a translation (scan) direction 606 of a semiconductor wafer 102 in accordance with an embodiment of the invention. The e-beam columns in the row 200 are arranged along a line in a direction 604 which is skew or non-perpendicular to the scan direction 606 of the wafer 102.

As shown in FIG. 6, the columns are spaced by a column spacing distance 310, while the dies 104 of the wafer 102 are spaced by a die spacing distance 308. In this example, the die spacing 308 is shorter than the column spacing 310. In other words, there is a mismatch between the die spacing and the column spacing.

However, because of the skew orientation, the projected column spacing 608 may be made to match the die spacing 308. The skew angle 607 may be determined to be equal to ninety degrees plus the inverse cosine of the die spacing 308 divided by the column spacing 310. In other words, consider that the die spacing 308 is d, the column spacing 310 is c, and the skew angle 607 is θ. $\theta = 90° + \cos^{-1}(d/c)$.

Because the projected column spacing 608 is commensurate with the die spacing 308, efficiencies and simplifications are introduced into the system. In an inspection system, the "care areas" per die according to the desired inspection plan may be efficiently scanned simultaneously by the multiple columns or beams. In an e-beam writing system, substantially the same deflection control signals may be sent to multiple columns sent to accomplish the desired writing pattern per die.

Figure 7:
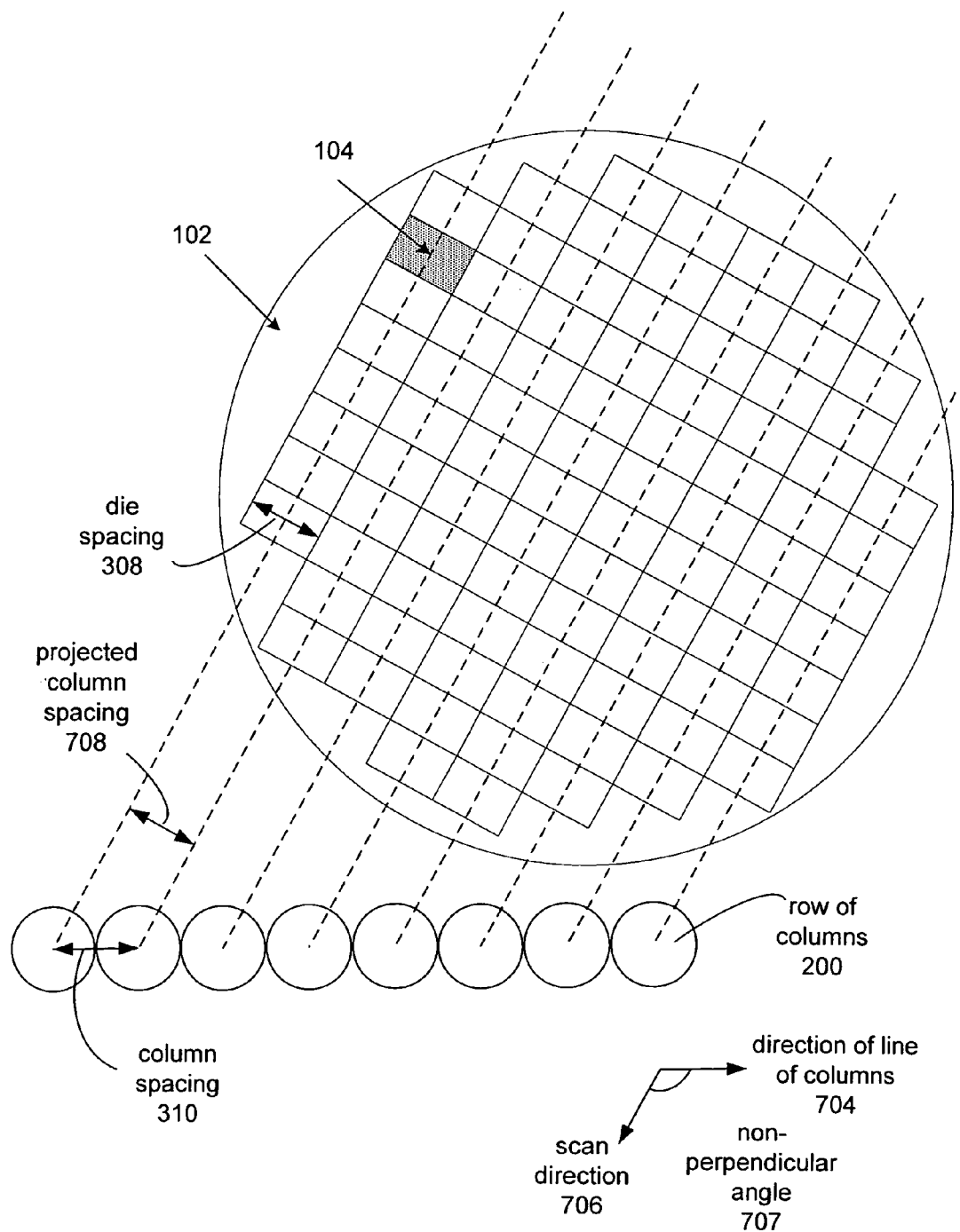
FIG. 7 is a schematic diagram illustrating a skew orientation of a translation direction of a semiconductor wafer with respect to a row of e-beam columns in accordance with an embodiment of the invention.

FIG. 7 is a schematic diagram illustrating a skew orientation 700 of a translation (scan) direction 706 of a semiconductor wafer 102 with respect to a row 200 of e-beam columns in accordance with an alternate embodiment of the invention. The e-beam columns in the row 200 are arranged along a line in a direction 704 which is skew or non-perpendicular to the scan direction 706 of the wafer 102.

As shown in FIG. 7, the columns are spaced by a column spacing distance 310, while the dies 104 of the wafer 102 are spaced by a die spacing distance 308. In this example, the die spacing 308 is shorter than the column spacing 310. In other words, there is a mismatch between the die spacing and the column spacing.

However, because of the skew orientation, the projected column spacing 708 may be made to match the die spacing 308. The skew or non-perpendicular angle 707 may be determined to be equal to ninety degrees plus the inverse cosine of the die spacing 308 divided by the column spacing 310. In other words, consider that the die spacing 308 is d, the column spacing 310 is c, and the skew angle 707 is θ. $\theta = 90° + \cos^{-1}(d/c)$.

Because the projected column spacing 708 is commensurate with the die spacing 308, efficiencies and simplifications are introduced into the system. In an inspection system, the "care areas" per die according to the desired inspection plan may be efficiently scanned simultaneously by the multiple columns or beams. In an e-beam writing system, substantially the same deflection control signals may be sent to multiple columns sent to accomplish the desired writing pattern per die.

Figure 8:
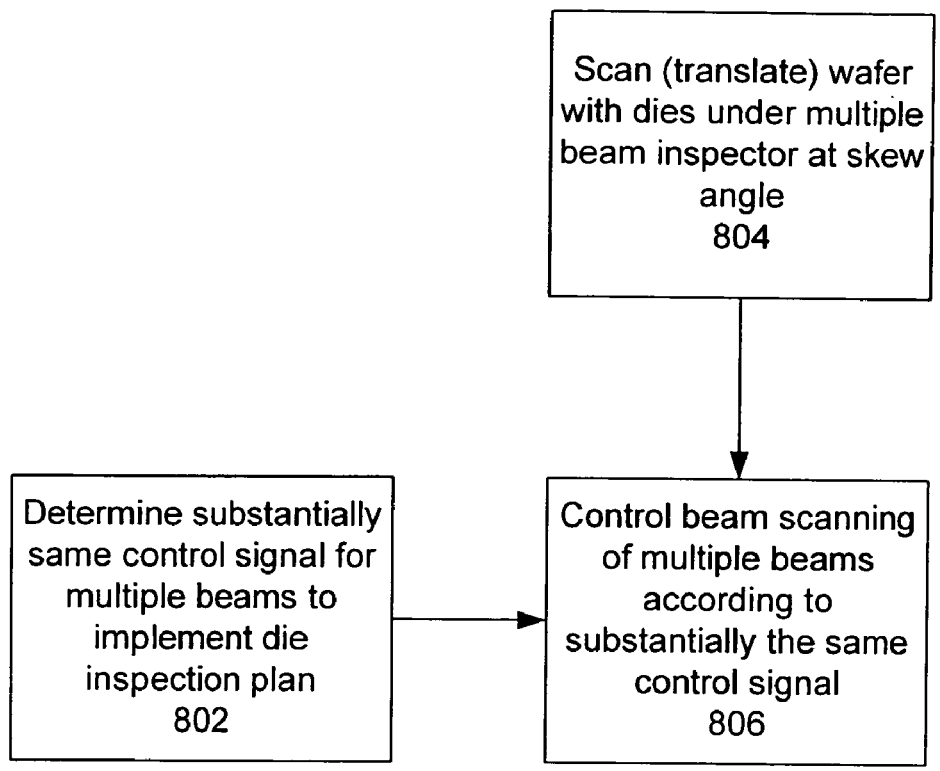
FIG. 8 is a flow chart of a method of multi-beam inspection utilizing a skew orientation in accordance with an embodiment of the invention.

FIG. 8 is a flow chart of a method 800 of multi-beam inspection utilizing a skew orientation in accordance with an embodiment of the invention. In this method 800, because the skew angle 607 between the scan direction 606 and the line of columns 604, a substantially the same control signal may be determined 802 for multiple beams so as to implement the desired die inspection plan. This is because of the projected column spacing 608 matches the die spacing 308. The match means that multiple columns are at a same location relative to the dies 104 on the wafer 102, so that substantially the same control signal may be sent to the multiple columns.

Hence, when a wafer with dies is scanned (translated) 804 under the multiple beam inspector with such a skew orientation, then the scanning of multiple beams may be controlled 806 according to substantially the same control signal. This introduces efficiencies into and simplifies the inspection system. For example, inspection "care areas" may be efficiently scanned simultaneously by the multiple beams.

Figure 9:
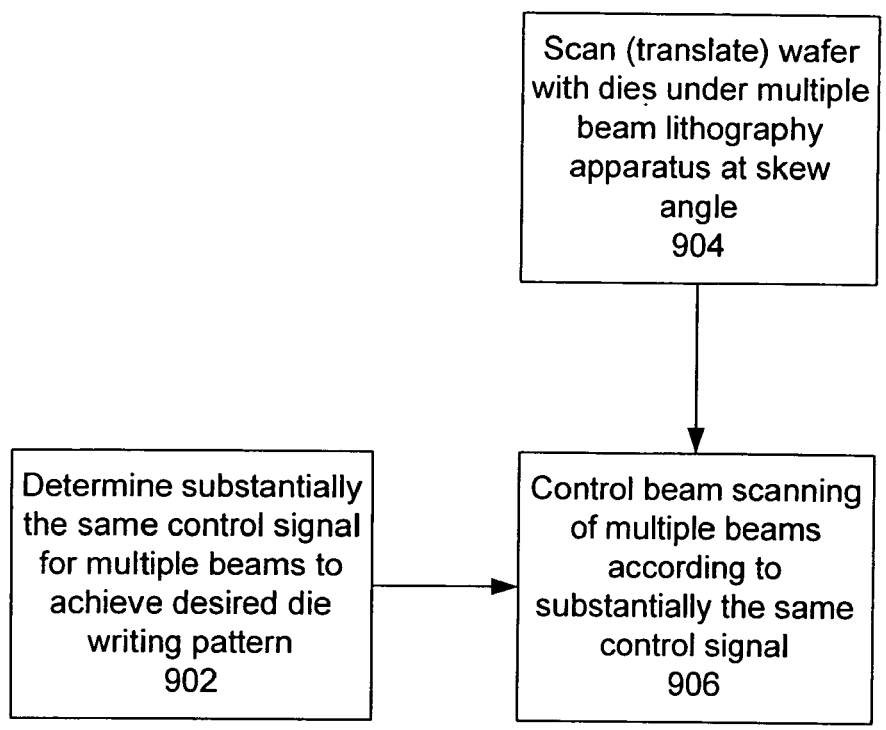
FIG. 9 is a flow chart of a method of multi-beam lithography utilizing a skew orientation in accordance with an embodiment of the invention.

FIG. 9 is a flow chart of a method 900 of multi-beam lithography utilizing a skew orientation in accordance with an embodiment of the invention. In this method 900, because the skew angle 607 between the scan direction 606 and the line of columns 604, substantially the same control signal may be determined 902 for multiple beams so as to achieve the desired die writing pattern. This is because of the match between the die spacing 608 and the projected column spacing 608. The match means that multiple columns are at a same location relative to the dies 104 on the wafer 102, so that substantially the same control signal may be used for the multiple columns.

Hence, when a wafer with dies is scanned (translated) 904 under the multiple beam e-beam lithography system with such a skew orientation, then the scanning of the multiple beams may controlled according to substantially the same control signal. This introduces efficiencies into and simplifies the e-beam lithography system. For example, the data path from a desired writing pattern to control signals for the columns becomes simplified.

Figure 10:
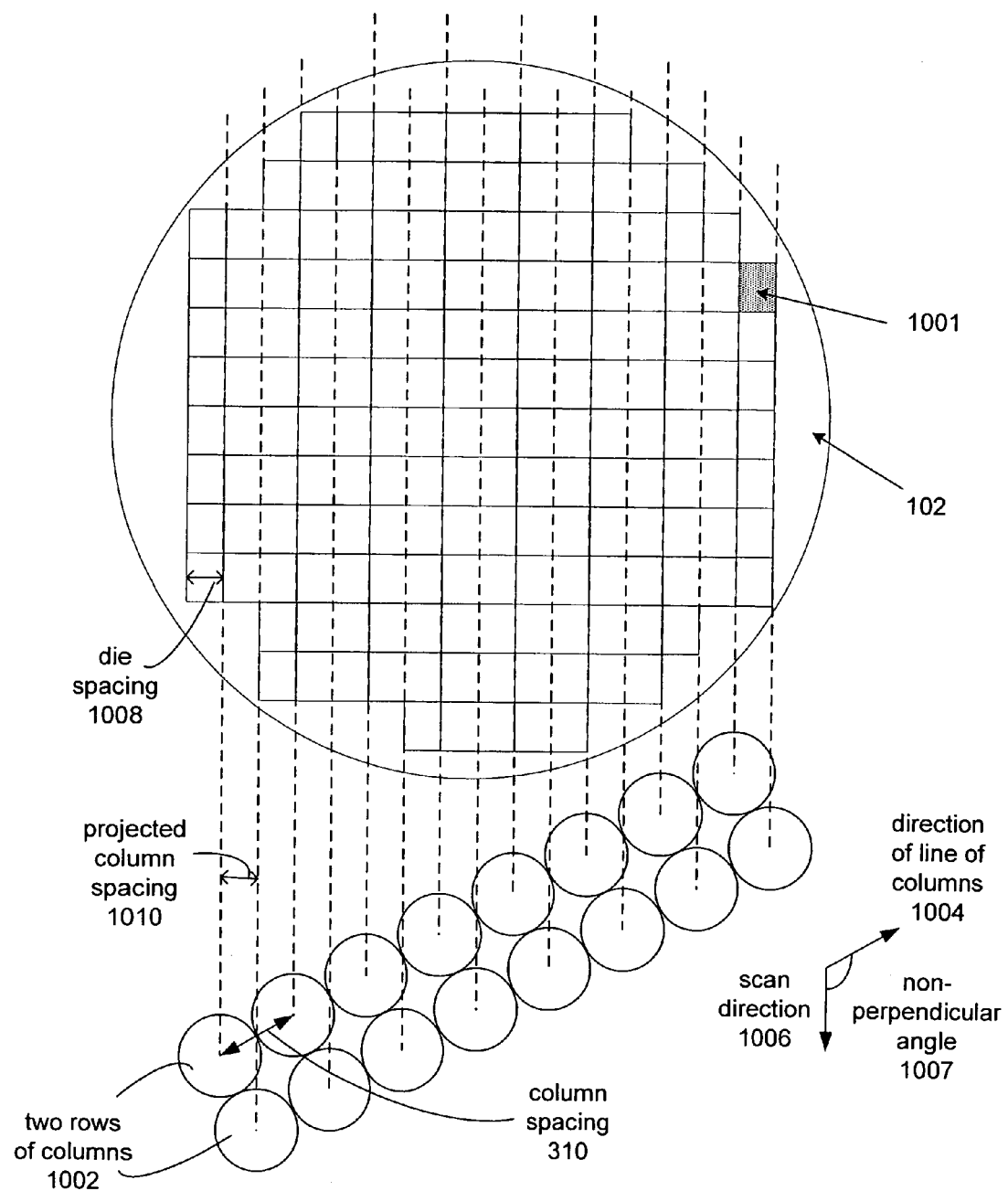
FIG. 10 is a schematic diagram illustrating a skew orientation of two rows of e-beam columns with respect to a translation direction of a semiconductor wafer in accordance with an embodiment of the invention.

FIG. 10 is a schematic diagram illustrating a skew orientation 1000 of two rows 1002 of e-beam columns with respect to a translation (scan) direction 1006 of a semiconductor wafer 102 in accordance with an embodiment of the invention. For this example, note that the size of the die 1001 is smaller than the die size in the previous examples. The e-beam columns in the rows 1002 are arranged along a direction 1004 which is skew or non-perpendicular to the scan direction 1006 of the wafer 102.

As shown in FIG. 10, the columns are spaced by a column spacing distance 310, while the dies 1001 of the wafer 102 are spaced by a die spacing distance 1008. In this example, because of the skew orientation, the projected column spacing 1010 between a column in one row and a next column in the other row may be made to match the die spacing 1008.

Figure 11:
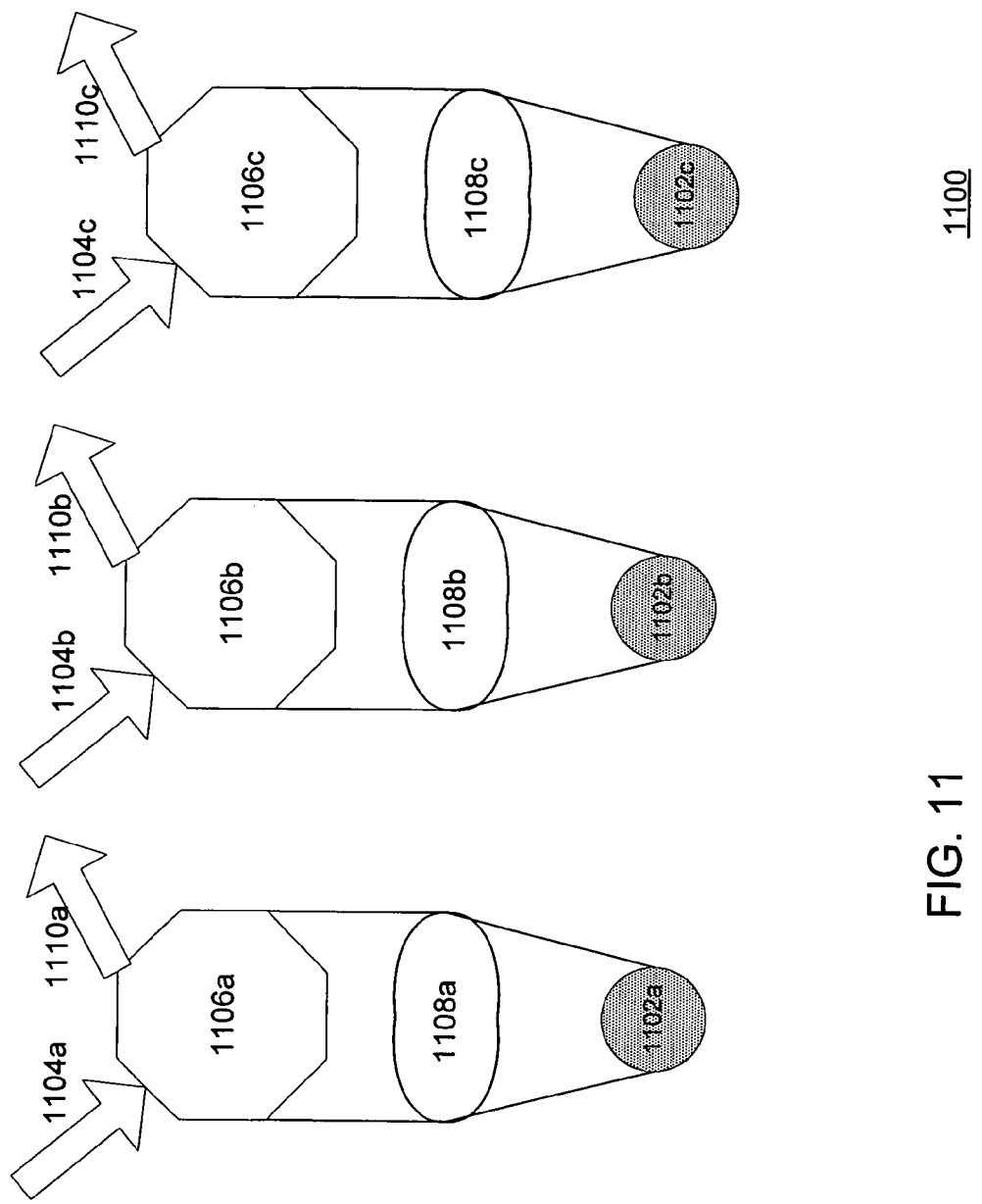
FIG. 11 is a schematic diagram illustrating elements of a multiple e-beam apparatus with a row of e-beam columns in accordance with an alternate embodiment of the invention.

FIG. 11 is a schematic diagram illustrating elements of a multiple e-beam apparatus with multiple e-beam columns in accordance with an alternate embodiment of the invention. The illustrated apparatus 1100 includes three columns (a, b, c) and forms three multi-pixel e-beam spots (1102a, 1102b, 1102c) onto a specimen being examined. While three columns are shown in FIG. 11 for purposes of ease of illustration, a multitude of such columns may be implemented, with the specific number depending on the system specifications.

In the embodiment illustrated, each column includes at least a source, a beam separator, and an objective lens. The sources, one for each column, generate incident multi-pixel beams (1104a, 1104b, 1104c). In one embodiment, each of the sources may comprise an electron source. The electron source may be implemented, for example, using a field emission electron gun and a condenser lens system.

The multi-pixel incident beams travel through beam separator devices (1106a, 1106b, 1106c). These beam separators separate the incident beams (1104a, 1104b, 1104c) from the scattered beams (1110a, 1110b, 1110c). Each beam separator may comprise, for instance, a magnetic beam separator that bends the incident beam to be directed along the optical axis to the normal of the surface to be inspected. Alternatively, other types of beam separators may be used, for example, those in a prism type configuration.

The incident beams subsequently travel from the separator devices to objective lenses (1108a, 1108b, 1108c). Each objective lens may comprise, for example, a configuration of electromagnetic pole pieces. Alternatively, one or more of the objective lenses may be electrostatic (rather than magnetic). The objective lenses focus the incident beams onto the two multiple-pixel areas (1102a, 1102b, 1102c) of the specimen.

In contrast to a typical scanning electron beam column where one single-pixel beam is scanned across an area, the columns in FIG. 11 impinge multiple-pixel incident beams onto the specimen and detect scattered electrons from the multiple pixels. This is advantageous in that data may be obtained in parallel from the multiple pixels within each beam spot. Moreover, the use of a multitude of such multi-pixel beams (instead of just one multi-pixel beam) further increases the efficiency such that the throughput of an inspector may be further improved by approximately a factor of two.

Due to impingement of the multiple incident beams onto the multiple-pixel areas (1102a, 1102b, 1102c), electrons are emitted from the surface of these areas. In a low energy electron microscopy (LEEM) type embodiment, the incident electrons are decelerated between the objective lenses and the specimen to a relatively low energy of one hundred electron volts (eV) or less, prior to impingement onto the specimen. The low-energy electrons interact with and reflect from the surface of the specimen. The reflected electrons are considered to be the scattered electrons. The scattered electrons from the multi-pixel areas are then re-accelerated as they return to the objective lenses.

Subsequently, the scattered electron beams (1110a, 1110b, 1110c) travel from the objective lenses to the two beam separators. The beam separators redirect the scattered electron beams to corresponding multi-pixel detection systems. Each multi-pixel detection system may be implemented, for example, with a charged-coupled device (CCD) array or other type of detector array.

While the e-beam columns of FIG. 2 comprise scanning electron beam columns, the e-beam columns of FIG. 11 comprise projection electron beam columns.

Embodiments of the invention may apply for various scanning beam or probe systems in which it is desirable to either write or collect information on a fixed pattern.

Applicants believe that without such a skew arrangement to make the die spacing and projected column spacing commensurate with each other, a sample inspection with a multi-beam system may not be much faster than a sample inspection with a single beam system.

An alternative of changing the column spacing mechanically may be done, but it may be more difficult and not as reliable. Instead, the skew angle of the present invention may be accomplished by rotating a column plate (a plate on which the multiple columns are on) so as to move the columns as a single unit.

The above-described diagrams are not necessarily to scale and are intended be illustrative and not limiting to a particular implementation. The above-described invention may be used in an automatic inspection or review system and applied to the inspection or review of semiconductor wafers and similar substrates in a production environment. In an alternate embodiment, the above-described invention may also be utilized for electron beam lithography applications.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A multiple electron beam apparatus comprising:
   multiple columns arranged in a row configured to generate multiple electron beams; and
   a mechanism for translating a substrate so as to be impinged upon by the multiple electron beams,
   wherein a direction of the substrate translation and a direction of the row of columns are at a skew angle; and
   wherein the skew angle comprises ninety degrees plus the inverse cosine of a die spacing divided by the column spacing.

2. The apparatus of claim 1, wherein the skew angle is such that a projected column spacing is commensurate to a spacing of patterns on the substrate.

3. The apparatus of claim 2, wherein the substrate comprises a semiconductor wafer, and the patterns on the substrate comprise dies on the wafer.

4. The apparatus of claim 1, wherein the apparatus comprises an electron beam inspection system.

5. The apparatus of claim 1, wherein the apparatus comprises an electron beam lithography system.

6. The apparatus of claim 1, wherein the multiple columns are arranged in a plurality of rows.

7. The apparatus of claim 1, wherein each column comprises a scanning electron beam column.

8. The apparatus of claim 1, wherein each column comprises a projection electron beam column.

9. A method of automated inspection of substrates, the method comprising:
   generating multiple beams from multiple devices in a linear arrangement; and translating a substrate under the multiple beams,
   wherein a direction of the substrate translation and a direction of the linear arrangement are at a skew angle; and
   wherein the skew angle comprises ninety degrees plus the inverse cosine of a die spacing divided by the column spacing.

10. The method of claim 9, wherein the skew angle is such that a projected device spacing is commensurate to a spacing of patterns on the substrate.

11. The method of claim 10, wherein the substrate comprises a semiconductor wafer, and the patterns on the substrate comprise dies on the wafer.

12. The method of claim 9, wherein the multiple devices are arranged in a plurality of rows.

13. The method of claim 9, wherein each device comprises a scanning electron beam column.

14. The method of claim 9, wherein each device comprises a projection electron beam column.

15. A method of electron beam lithography, the method comprising:
   generating multiple beams from multiple devices in a linear arrangement; and translating a substrate under the multiple beams,
   wherein a direction of the substrate translation and a direction of the linear arrangement are at a skew angle; and
   wherein the skew angle comprises ninety degrees plus the inverse cosine of a die spacing divided by the column spacing.

16. The method of claim 15, wherein the skew angle is such that a projected device spacing is commensurate to a spacing of patterns on the substrate.

17. The method of claim 16, wherein the substrate comprises a semiconductor wafer, and the patterns on the substrate comprise dies on the wafer.

18. The method of claim 15, wherein the multiple devices are arranged in a plurality of rows.

19. The method of claim 15, wherein each device comprises a scanning electron beam column.

* * * * *